United States Patent
Han et al.

(10) Patent No.: US 9,541,809 B2
(45) Date of Patent: Jan. 10, 2017

(54) ARRAY SUBSTRATE AND DISPLAY APPARATUS HAVING THE SAME

(71) Applicant: Samsung Display Co., Ltd., Yongin (KR)

(72) Inventors: Yun-Seok Han, Daegu (KR); Seul-Ki Kim, Incheon (KR); Seung-Jin Kim, Asan-si (KR); Jeong-Hyun Lee, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 127 days.

(21) Appl. No.: 14/470,969

(22) Filed: Aug. 28, 2014

(65) Prior Publication Data
US 2015/0241747 A1    Aug. 27, 2015

(30) Foreign Application Priority Data
Feb. 27, 2014    (KR) .......................... 10-2014-0023536

(51) Int. Cl.
G02F 1/136    (2006.01)
G02F 1/1362   (2006.01)
H01L 27/12    (2006.01)
G02F 1/1345   (2006.01)

(52) U.S. Cl.
CPC ..... *G02F 1/136259* (2013.01); *G02F 1/13458* (2013.01); *G02F 1/136286* (2013.01); *H01L 27/124* (2013.01)

(58) Field of Classification Search
CPC ............ G02F 1/136259; G02F 1/13458; G02F 1/136286; G02F 2001/136254; G02F 1/13452; G02F 2001/136272; H01L 27/124
USPC .......................................................... 349/40
See application file for complete search history.

(56) References Cited

U.S. PATENT DOCUMENTS

| | | |
|---|---|---|
| 5,760,855 A | 6/1998 | Nakase et al. |
| 6,791,632 B2 | 9/2004 | Lee et al. |
| 7,714,589 B2 | 5/2010 | Jun et al. |
| 2010/0323482 A1* | 12/2010 | Choi .................... G02F 1/13458 438/158 |
| 2013/0242215 A1 | 9/2013 | Chang |

FOREIGN PATENT DOCUMENTS

| | | |
|---|---|---|
| KR | 10-0318541 | 12/2001 |
| KR | 10-2006-0024530 | 3/2006 |
| KR | 10-2008-0022800 | 3/2008 |

* cited by examiner

*Primary Examiner* — Nathanael R Briggs
(74) *Attorney, Agent, or Firm* — H.C. Park & Associates, PLC

(57) ABSTRACT

An array substrate includes a plurality of data lines, a plurality of gamma lines, a repair pad, a repair line, an inspection pad and an inspection line. The data lines transmit a data voltage to an active region. The gamma lines apply a gamma reference voltage to generate the data voltage. The repair pad repairs the data line. The repair line extends from the repair pad. The repair line is disposed adjacent to the gamma line. The inspection pad applies an inspection signal. The inspection line extends from the inspection pad. The inspection line is connected to the data lines. The gamma lines are connected to the inspection line.

19 Claims, 6 Drawing Sheets

ARRAY SUBSTRATE AND DISPLAY APPARATUS HAVING THE SAME

CROSS REFERENCE TO RELATED APPLICATION

This application claims priority from and the benefit of Korean Patent Application No. 10-2014-0023536, filed on Feb. 27, 2014, which is hereby incorporated by reference for all purposes as if fully set forth herein.

BACKGROUND

Field

Exemplary embodiments of the present inventive concept relate to an array substrate and a display apparatus including the array substrate. More particularly, exemplary embodiments of the present inventive concept relate to an array substrate capable of reducing the rate of defects and improving a yield rate, and a display apparatus including the array substrate.

Discussion of the Background

Generally, a liquid crystal display ("LCD") apparatus may include a first substrate including a pixel electrode, a second substrate including a common electrode, and a liquid crystal layer disposed between the first and second substrate. An electric field may be generated by applying voltages to the pixel electrode and the common electrode. By adjusting the intensity of the electric field, a transmittance of a light passing through the liquid crystal layer may be adjusted, so that an image may be displayed.

Generally, the display apparatus may include a display panel and a panel drive. The display panel may include a plurality of gate lines and a plurality of data lines. The panel driver may include a gate driver providing gate signals to the gate lines and a data driver providing data voltages to the data lines.

For example, the data driver may be formed on the display panel in a chip-on-glass ("COG") type. Accordingly, the data line, a gamma line, a repair line to repair the data line, and an inspection line to inspect a defect may be disposed on an array substrate of the display panel.

The gamma line may be cut due to static electricity applied to the repair line so that a display defect may be generated. The display defect due to the cut in the gamma line is not easily detected prior to connecting a driving chip and a printed circuit, so that the driving chip and the printed circuit may be connected to the defected substrate. Thus, the manufacturing cost of the display panel may increase since the driving chip and printed circuit must be removed to repair the display defect.

SUMMARY OF THE INVENTIVE CONCEPT

Exemplary embodiments of the present inventive concept provide an array substrate capable of reducing the defect rate of a display panel.

Exemplary embodiments of the present inventive concept also provide a display apparatus including the array substrate.

Additional features of the invention will be set forth in the description which follows, and in part will be apparent from the description, or may be learned by practice of the invention.

In an exemplary embodiment of an array substrate according to the present inventive concept, the array substrate includes a plurality of data lines, a plurality of gamma lines, a repair pad, a repair line, an inspection pad and an inspection line. The data lines transmit a data voltage to an active region. The gamma lines apply a gamma reference voltage to generate the data voltage. The repair pad repairs the data line. The repair line extends from the repair pad. The repair line is disposed adjacent to the gamma line. The inspection pad applies an inspection signal. The inspection line extends from the inspection pad. The inspection line is connected to the data lines. The gamma lines are connected to the inspection line.

In an exemplary embodiment of an array substrate according to the present inventive concept, the array substrate includes a plurality of data lines, a plurality of gamma lines, a repair pad and a repair line. The data lines transmit a data voltage to an active region. The gamma lines apply a gamma reference voltage to generate the data voltage. The repair pad repairs the data line. The repair line extends from the repair pad. The repair line is disposed adjacent to the gamma line. The gamma lines are connected to one another.

In an exemplary embodiment of an array substrate according to the present inventive concept, the array substrate includes a plurality of data lines configured to transmit a data voltage to an active region and a plurality of gamma lines configured to apply a gamma reference voltage to generate the data voltage. The gamma lines extend to a cutting line of the array substrate.

In an exemplary embodiment of a display apparatus according to the present inventive concept, the display apparatus includes an array substrate and a data driving chip. The array substrate includes a plurality of data lines, a plurality of gamma lines, a repair pad, a repair line, an inspection pad and an inspection line. The data lines transmit a data voltage to an active region. The gamma lines apply a gamma reference voltage to generate the data voltage. The repair pad repairs the data line. The repair line extends from the repair pad. The repair line is disposed adjacent to the gamma line. The inspection pad applies an inspection signal. The inspection line extends from the inspection pad. The inspection line is connected to the data lines. The data driving chip overlaps the data lines and the gamma lines. The data driving chip is mounted on the array substrate. The gamma lines are connected to the inspection line.

According to the array substrate and the display apparatus including the array substrate, the gamma lines are connected to the inspection line which is connected to the inspection pad or the gamma lines are connected to one another so that the static electricity flowing from the repair line to the gamma line may be dispersed. Thus, the defect rate of the display panel due to the cut of the gamma line may be reduced.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
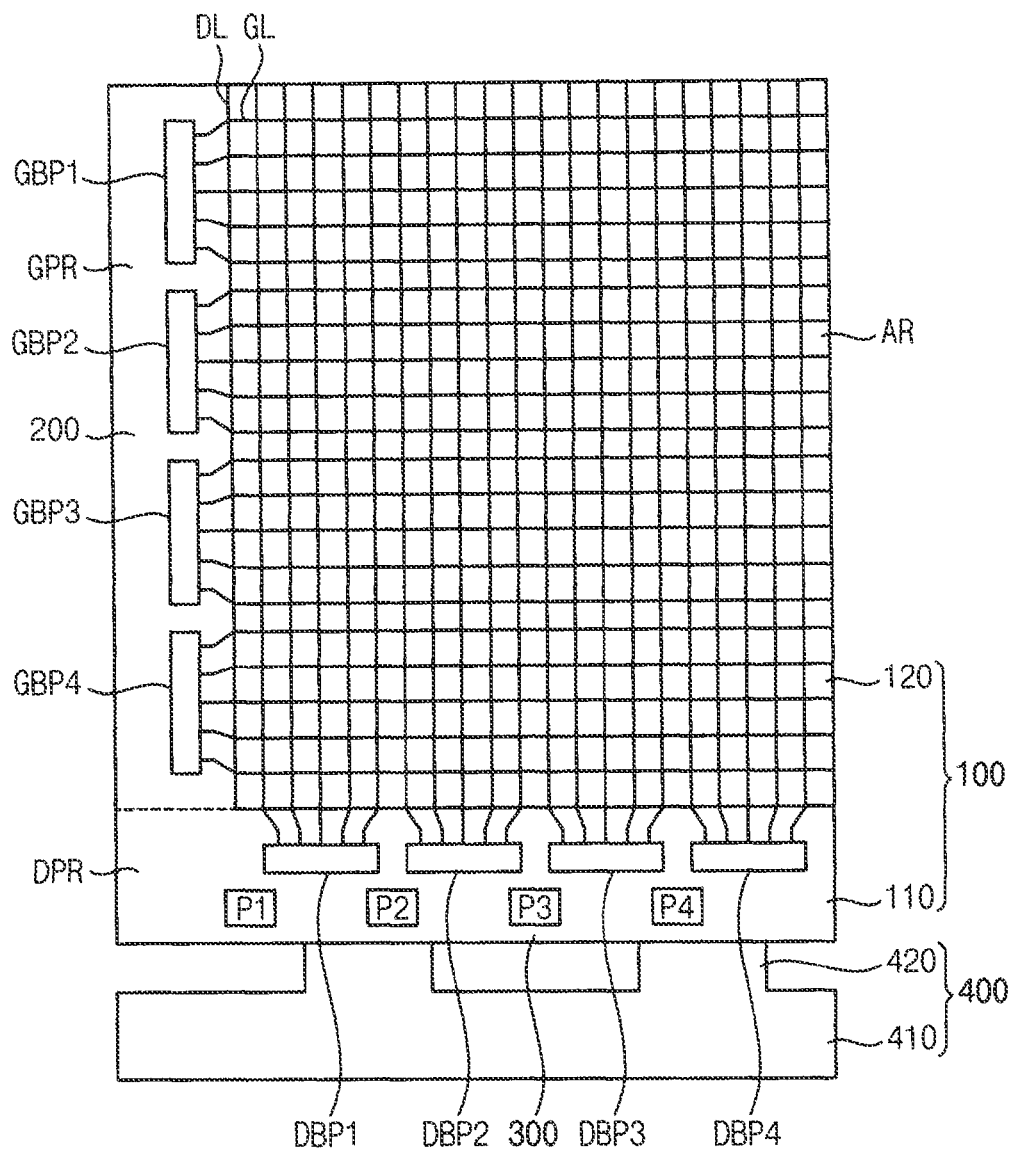
FIG. 1 is a plan view illustrating a display apparatus according to an exemplary embodiment of the present inventive concept.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

FIG. 1 is a plan view illustrating a display apparatus according to an exemplary embodiment of the present inventive concept.

Referring to FIG. 1, the display apparatus includes an array substrate 110, a controller 400 connected to the array substrate 110, a counter substrate (120) facing the array substrate 110, and a liquid crystal layer (not shown) disposed between the array substrate 110 and the counter substrate 120. The counter substrate 120 may include a color filter and a common electrode. The counter substrate 120 may be a color filter substrate.

The array substrate 110 includes an active region AR for displaying an image, and a data peripheral region DPR and a gate peripheral region GPR that are disposed adjacent to the active region AR. A plurality of gate lines GL, a plurality of data lines DL, and a plurality of switching elements connected to the gate lines GL and the data lines DL, are disposed in the active region AR. The gate lines GL may extend in a first direction D1, and the data lines DL may extend in a second direction D2 crossing the first direction D1.

Gate bump groups GBP1, GBP2, GBP3, and GBP4 to connect the gate lines GL to a gate driving chip are disposed in the gate peripheral region GPR. For example, a first gate driving chip may be mounted on a first gate bump group GBP1 so that the first gate driving chip may be represented as GBP1 in FIG. 1. A second gate driving chip may be mounted on a second gate bump group GBP2 so that the second gate driving chip may be represented as GBP2 in FIG. 1. A third gate driving chip may be mounted on a third gate bump group GBP3 so that the third gate driving chip may be represented as GBP3 in FIG. 1. A fourth gate driving chip may be mounted on a fourth gate bump group GBP4 so that the fourth gate driving chip may be represented as GBP4 in FIG. 1.

Although four gate driving chips are mounted on the array substrate 110 in the present exemplary embodiment, the present inventive concept is not limited to the number of the gate driving chips, and any number may be included depending on need.

Data bump groups DBP1, DBP2, DBP3, and DBP4 are disposed in the data peripheral region DPR, and connect the data lines DL to a data driving chip (not shown) and a pad part P1, P2, P3 and P4. The pad parts P1, P2, P3, and P4 may each include a repair pad and an inspection pad. For example, a first data driving chip may be mounted on a first data bump group DBP1 so that the first data driving chip may be represented as DBP1 in FIG. 1. A second data driving chip may be mounted on a second data bump group DBP2 so that the second data driving chip may be represented as DBP2 in FIG. 1. A third data driving chip may be mounted on a third data bump group DBP3 so that the third data driving chip may be represented as DBP3 in FIG. 1. A fourth data driving chip may be mounted on a fourth data bump group DBP4 so that the fourth data driving chip may be represented as DBP4 in FIG. 1.

A first pad part P1 is disposed adjacent to the first data bump group DBP1. The first pad part P1 may be used to repair the data lines connected to the first data bump group DBP1 or provides an inspection signal to the data lines connected to the first data bump group DBP1. A second pad part P2 is disposed adjacent to the second data bump group DBP2. The second pad part P2 may be used to repair the data lines connected to the second data bump group DBP2 or provide an inspection signal to the data lines connected to the second data bump group DBP2. A third pad part P3 is disposed adjacent to the third data bump group DBP3. The third pad part P3 may be used to repair the data lines connected to the third data bump group DBP3 or provide an inspection signal to the data lines connected to the third data bump group DBP3. A fourth pad part P4 is disposed adjacent to the fourth data bump group DBP4. The fourth pad part P4 may be used to repair the data lines connected to the fourth data bump group DBP4 or provide an inspection signal to the data lines connected to the fourth data bump group DBP4.

Although four data driving chips are mounted on the array substrate 110 in the present exemplary embodiment, the present inventive concept is not limited to the number of the data driving chips. In addition, although four pad parts are disposed on the array substrate 110 in the present exemplary embodiment, the present inventive concept is not limited to the number of the pad parts. Although the number of the pad parts is same as the number of the data driving chips in the present exemplary embodiment, the present inventive concept is also not limited thereto. Alternatively, the number of the pad parts may be different from the number of the data driving chips.

The controller 400 includes a printed circuit board 410 and a flexible printed circuit board 420 connecting the printed circuit board 410 to the array substrate 110.

A timing controller, a power voltage generator, and a gamma reference voltage generator may be disposed on the printed circuit board 410. The timing controller may receive input image data and an input control signal from an external apparatus (not shown). The input image data may include red image data, green image data, and blue image data. The input control signal may include a master clock signal and a data enable signal. The input control signal may further include a vertical synchronizing signal and a horizontal synchronizing signal.

The timing controller may generate a first control signal, a second control signal, a third control signal, and a data signal. The timing controller may generate the first control signal, based on the input control signal, and output the first control signal to control an operation of the gate driver 200. The first control signal may include a vertical start signal and a gate clock signal.

The timing controller generates the second control signal, based on the input control signal, to control an operation of the data driver 300, and outputs the second control signal to the data driver 300. The second control signal may include a horizontal start signal and a load signal.

The timing controller may generate a data signal based on the input image data. The timing controller may output the data signal to the data driver 300.

The timing controller may generate a third control signal, based on the input control signal, to control an operation of the gamma reference voltage generator, and output the third control signal to the gamma reference voltage generator.

The power voltage generator may provide a power voltage for driving the display panel 100. For example, the power voltage generator may generate a logic power voltage, an analog power voltage and a common voltage.

The gate driver 200 may include a plurality of gate driving chips. The gate driving chips are disposed on the gate bump groups GBP1, GBP2, GBP3, and GBP4 of the array substrate 110. The gate driving chip may partially overlap the gate lines GL on the array substrate 110.

The gate driver 200 may be a chip-on-glass ("COG") type. In the chip-on glass type, the gate driver 200 may include a gate driving chip directly mounted on the array substrate 110. Additionally or alternatively, the gate driver 200 may be connected to the array substrate 110 as a tape carrier package ("TCP") type. Additionally or alternatively, the gate driver 200 may be integrated with the gate peripheral region GPR of the display panel 100.

The gate driver 200 may generate gate signals driving the first lines GL in response to the first control signal received from the timing controller. The gate driver 200 sequentially outputs the gate signals to the gate lines GL.

The gamma reference voltage generator may generate a gamma reference voltage in response to the third control signal received from the timing controller. The gamma reference voltage generator may provide the gamma reference voltage to the data driver 300 through the gamma lines disposed on the array substrate 110. The gamma reference voltage may have a value corresponding to the data signal.

The data driver 300 includes a plurality of the data driving chips. The data driving chips are disposed on the data bump groups DBP1, DBP2, DBP3 and DBP4 of the array substrate 110. The data driving chip may partially overlap the data lines DL and the gamma lines.

In the present exemplary embodiment, the data driver 300 may be a COG type. In the COG type, the data driver 300 may include a data driving chip which is directly mounted on the array substrate 110.

The data driver 300 may receive the second control signal and the data signal from the timing controller. The data driver 300 may receive the gamma reference voltage from the gamma reference voltage generator. The data driver 300 may use the gamma reference voltage to convert the data signal into an analog type data voltage. The data driver 300 outputs the data voltage to the data lines DL.

Figure 2:
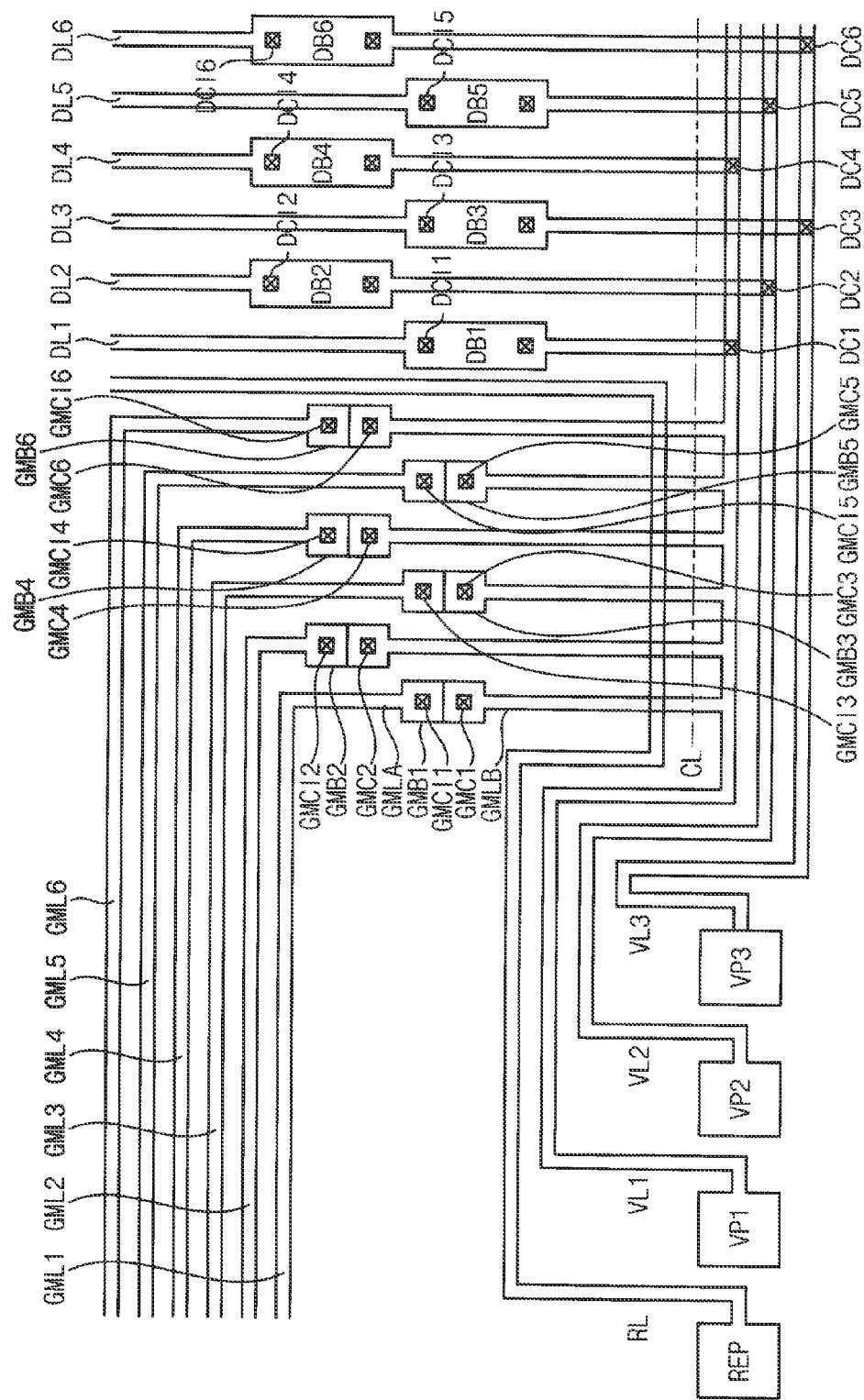
FIG. 2 is a plan view illustrating a first pad part and a first data bump group of FIG. 1.
Figure 3:
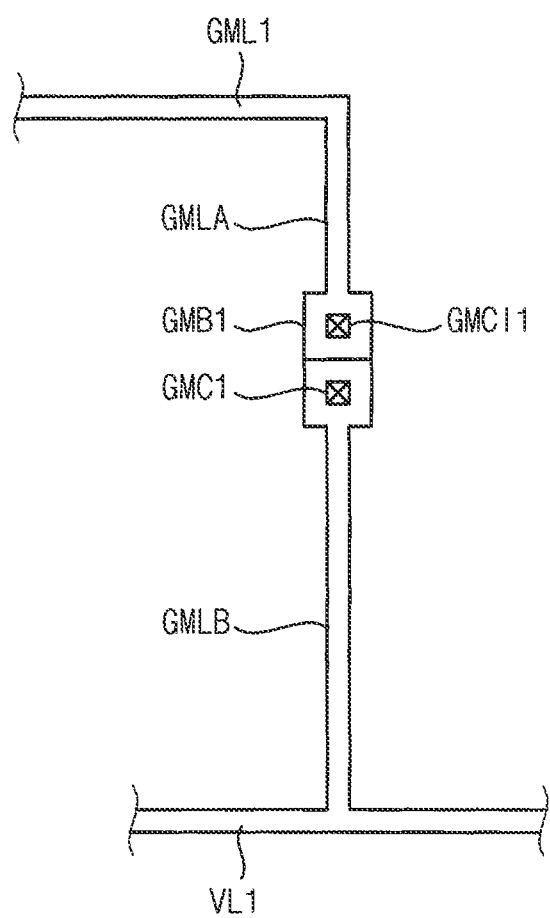
FIG. 3 is a plan view illustrating a first gamma line of FIG. 2.

FIG. 2 is a plan view illustrating the first pad part P1 and the first data bump group DBP1 of FIG. 1. FIG. 3 is a plan view illustrating a first gamma line GML1 of FIG. 2.

Referring to FIGS. 1 to 3, the data lines DL1 to DL6, the gamma lines GML1 to GML6, a repair pad REP, a repair line RL, inspection pads VP1, VP2, and VP3, and inspection lines VL1, VL2, and VL3, are disposed in the data peripheral region DPR of the array substrate 110.

The data lines DL1 to DL6 may receive the data voltage from the data driving chip and may transmit the data voltage to the active region AR. The data lines DL1 to DL6 include data bump parts DB1 to DB6, respectively, to connect the data lines DL1 to DL6 to the data driving chip. The data bump parts DB1 to DB6 include data chip contact part DCI1 to DCI6, respectively, at which the data driving chip is connected to the data lines DL1 to DL6.

The gamma lines GML1 to GML6 may receive the gamma reference voltage from the gamma reference voltage generator. The gamma lines GML1 to GML6 may transmit the gamma reference voltage to the data driving chip. The gamma lines GML1 to GML6 include gamma bump parts GMB1 to GMB6, respectively, to connect the gamma lines GML1 to GML6 to the data driving chip. The gamma bump parts GMB1 to GMB6 include gamma chip contact parts GMCI1 to CMCI6, respectively, at which the data driving chip is connected to the gamma lines GML1 to GML6.

The repair pad REP may transmit a repair signal to the active region AR through the repair line RL in order to repair the data line DL. The repair line RL extends from the repair pad REP. The repair line RL may be disposed adjacent to the gamma lines GML1 to GML6. The repair line RL may be disposed between the gamma lines GML1 to GML6 and the data lines DL1 to DL6.

In the present exemplary embodiment, a data repair method of the repair pad REP may be a ring repair method.

The inspection pads VP1, VP2, and VP3 apply the inspection signal for inspecting a display defect of the display panel 100 to the data lines DL1 to DL6. A first inspection pad VP1 may apply a first inspection signal to a first data line DL1 and a fourth data line DL4. A second inspection pad VP2 may apply a second inspection signal to a second data line DL2 and a fifth data line DL5. A third inspection pad VP3 may apply a third inspection signal to a third data line DL3 and a sixth data line DL6. However, exemplary embodiments of the present inventive concept are not limited thereto, and any number of inspection pads may apply inspection signals to any number of data lines.

The inspection lines VL1, VL2, and VL3 extend from the inspection pads VP1, VP2, and VP3, respectively. The inspection lines VL1, VL2, and VL3 are connected to the data lines DL1 to DL6. The first inspection line VL1 may include a first data contact part DC1 to connect the first inspection line VL1 to the first data line DL1, and a fourth data contact part DC4 to connect the first inspection line VL1 to the fourth data line DL4. The second inspection line VL2 may include a second data contact part DC2 to connect the second inspection line VL2 to the second data line DL2, and a fifth data contact part DC5 to connect the second inspection line VL2 to the fifth data line DL5. The third inspection line VL3 may include a third data contact part DC3 to connect the third inspection line VL3 to the third data line DL3, and a sixth data contact part DC6 to connect the third inspection line VL3 to the sixth data line DL6.

In an exemplary embodiment, the display panel 100 may be inspected by a visual inspection.

The repair pad REP and the repair line RL have a larger area relative to the gamma lines GML1 to GML6. When static electricity is applied to the repair pad REP, the static electricity may flow from the repair pad REP and through the repair line RL. The static electricity may be transmitted from the repair line RL to at least one of the gamma lines GML1 to GML6 so that the gamma lines GML1 to GML6 may be burnt and cut.

Hereinafter, a structure of the first gamma line GML1 is explained referring again to FIG. 3 in detail.

The first gamma line GML1, including a first gamma bump part GMB1, may be connected to the data driving chip. The first gamma bump part GMB1 includes a first contact part GMCI1, at which the first gamma line GML1 may be connected to the data driving chip.

The first gamma line GML1 further includes a first portion GMLA disposed at a first side of the first gamma bump part GMB1 and a second portion GMLB disposed at a second side of the first gamma bump part GMB1, opposite to the first side. The second portion GMLB of the first gamma line GML1 is connected to the first inspection line VL1.

The first portion GMLA has a smaller width than a width of the first gamma bump part GMB1. The second portion GMLB has a smaller width than the width of the first gamma bump part GMB1.

In the present exemplary embodiment, the first portion GMLA may be formed from a first metal layer and the second portion GMLB may be formed from a second metal layer different from the first metal layer. Thus, the first gamma line GML1 further includes a second contact part GMC1 at which the first portion GMLA and the second portion GMLB may be connected. For example, the second contact part GMC1 is disposed in the first gamma bump part GMB1.

For example, the first portion GMLA may be formed from a gate metal layer and the second portion GMLB may be formed from a data metal layer. In addition, the repair line RL may be formed from the gate metal layer. The inspection lines VL1, VL2, and VL3 may be formed from the data metal layer. The data lines DL1 to DL6, which may overlap with the data driving chip, may be formed from the gate metal layer. While the data lines DL1 to DL6 that overlap with the data driving chip may be formed from the gate metal layer, the data lines DL1 to DL6 in the active region AR may be formed from the data metal layer. Thus, the data lines DL1 to DL6 in the data peripheral region DPR may have a double layer structure and may include the contact part to connect two layers. A gate metal pattern may be formed from the gate metal layer using a single mask. Both an active pattern and a data metal pattern may be simultaneously formed from the data metal layer using a single mask so that the data metal pattern may have a relatively greater width than a width of the gate metal pattern. Therefore, in the data bump groups DBP1 to DBP6, which have narrow gaps between the data lines DL1 to DL6 and gamma lines GML1 to GML6, the gamma lines GML1 to GML6 and the data lines DL1 to DL6 may be formed from the gate metal layer.

The second portion GMLB may be disposed on the same layer as the inspection lines VL1, VL2, and VL3.

A cutting line CL is formed between the first gamma bump parts GMB1 to GMB6 and the inspection lines VL1 to VL3. In a first inspection step using the inspection pads VP1 to VP3, the array substrate is not cut at the cutting line CL. In the first inspection step, the display panel 100 is inspected using the first to third inspection pads VP1, VP2, and VP3.

When the first inspection step finishes, the array substrate 110 is cut at the cutting line CL. The second portion GMLB of the gamma lines GML1 to GML6 are cut along cutting line CL. Thus, a portion below the cutting line CL does not affect the display panel 100 after the first inspection step.

After cutting the array substrate 110 at the cutting line CL, the gate driving chip and the data driving chip are mounted on the array substrate 110, and the printed circuit board 410 is attached to the array substrate 110 through the flexible printed circuit board 420. Then, a second inspection step is performed.

After the first inspection step, the array substrate 110 may be trimmed along the cutting line CL. For example, the array substrate 110 may be edge-grinded along the cutting line CL.

After the first inspection step, the portion below the cutting line CL may remain as a portion of the array substrate 110. Alternatively, after the first inspection step, the portion below the cutting line CL may be divided and eliminated from the array substrate 110.

In the present exemplary embodiment, the gamma lines GML1 to GML6 are cut at the cutting line CL of the array substrate 110. Thus, the gamma lines GML1 to GML6 extend to the cutting line CL of the array substrate 110.

According to the present exemplary embodiment, the gamma lines GML1 to GML6 are connected to the first inspection line VL1 so that total area of lines and electrodes connected to the gamma lines GML1 to GML6 increases. Thus, static electricity flowing through the repair line RL may not be transmitted from the repair line RL to the gamma lines GML1 to GML6, so that the gamma lines GML1 to GML6 may not be burnt or cut. Therefore, defects in the display panel 100 may be reduced.

Figure 4:
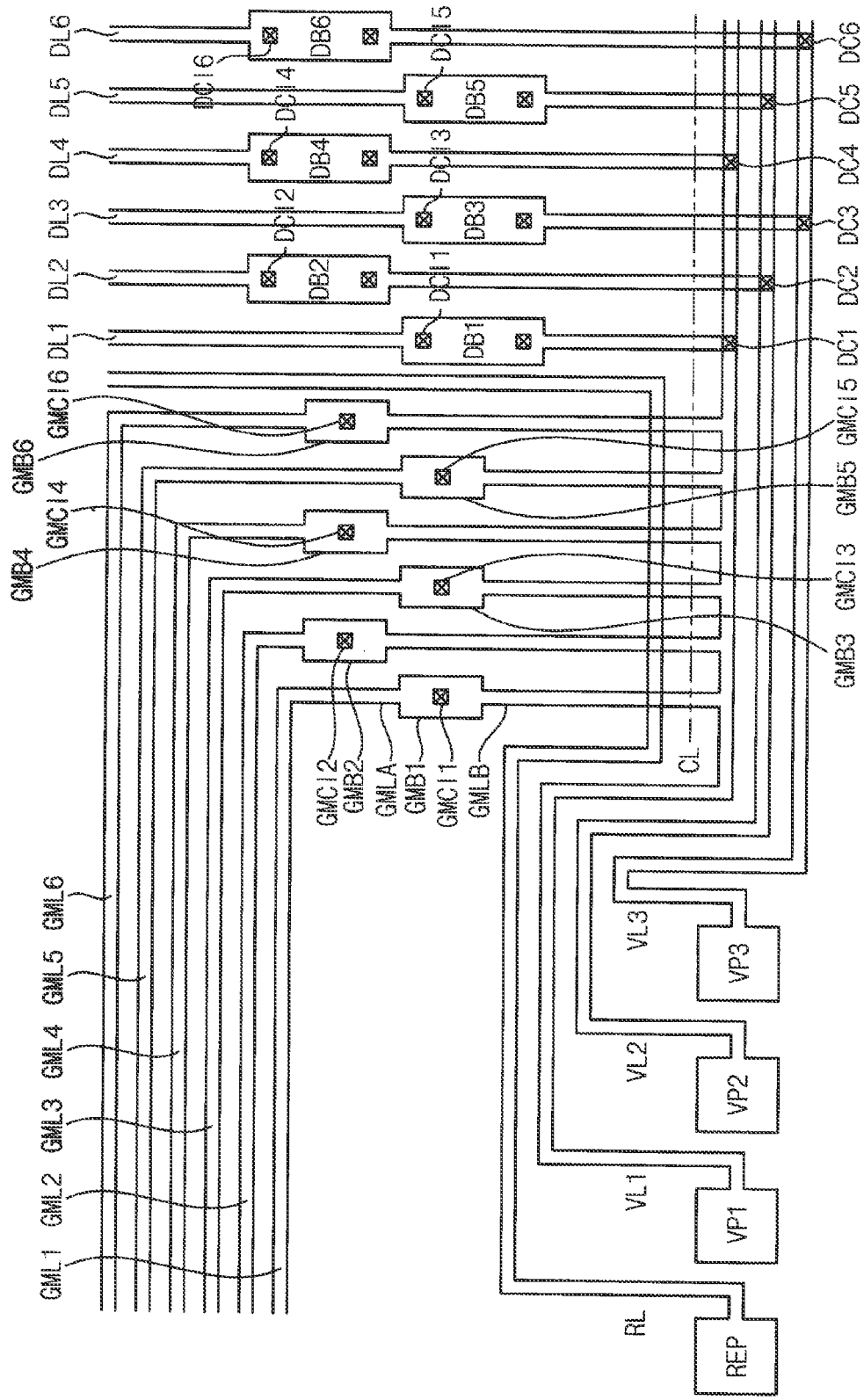
FIG. 4 is a plan view illustrating a first pad part and a first data bump group according to an exemplary embodiment of the present inventive concept.
Figure 5:
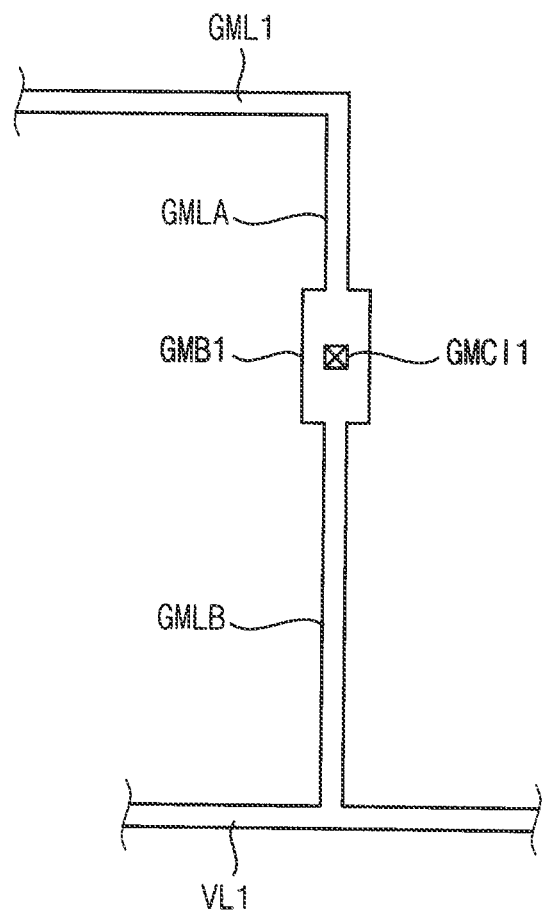
FIG. 5 is a plan view illustrating a first gamma line of FIG. 4.

FIG. 4 is a plan view illustrating a first pad part P1 and a first data bump group DBP1 according to an exemplary embodiment of the present inventive concept. FIG. 5 is a plan view illustrating a first gamma line GML1 of FIG. 4.

The array substrate and the display apparatus according to the present exemplary embodiment are substantially the same as the array substrate and the display apparatus of the previous exemplary embodiment explained referring to FIGS. 1 to 3, except that the first portion and the second portion of the gamma line are disposed on the same layer. Thus, the same reference numerals will be used to refer to the same or like parts as those described in the previous exemplary embodiment of FIGS. 1 to 3 and any repetitive explanation concerning the above elements will be omitted.

Figure 6:
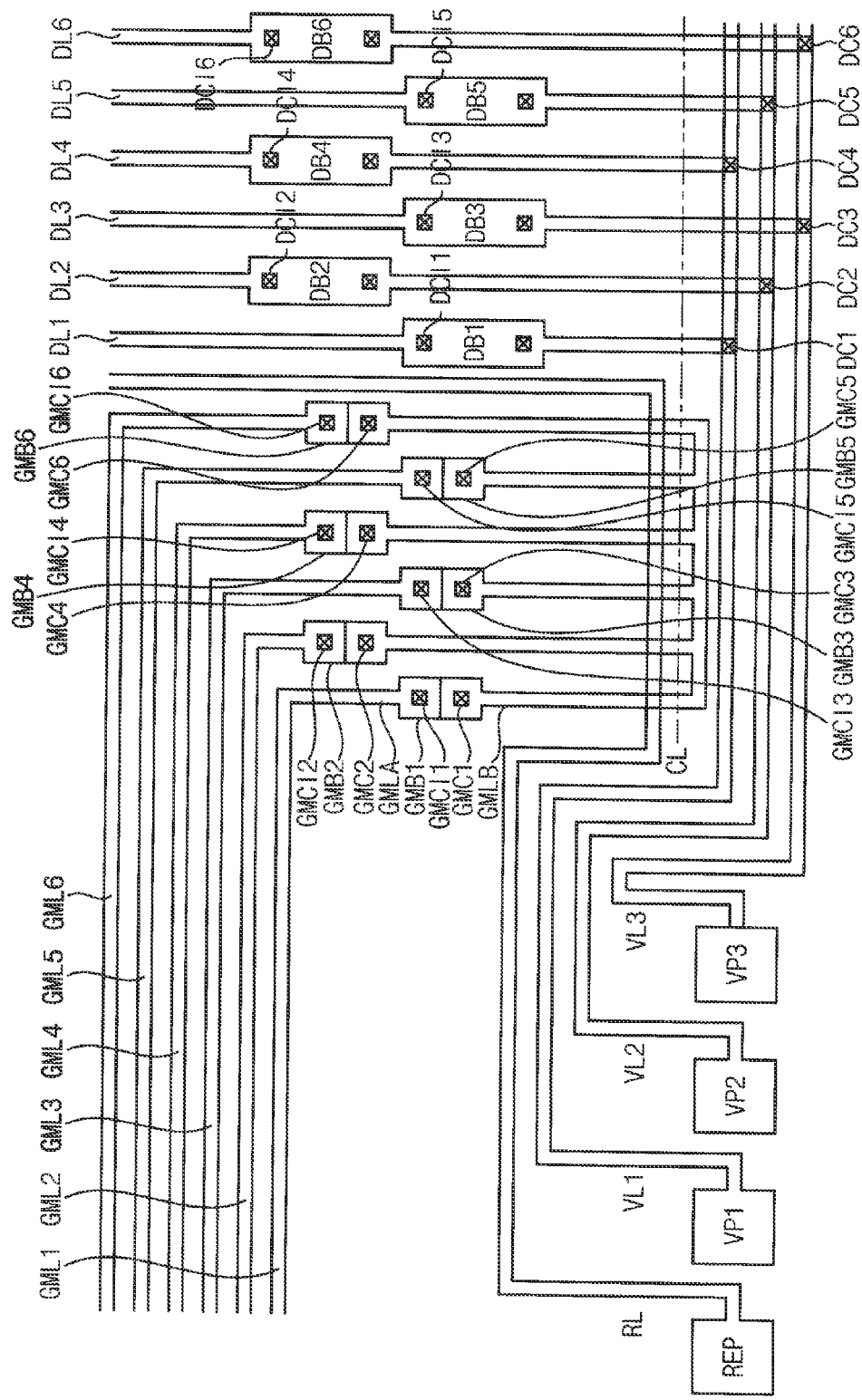
FIG. 6 is a plan view illustrating a first pad part and a first data bump group according to an exemplary embodiment of the present inventive concept.

Referring to FIGS. 1, 4 and 6, the display apparatus may include a display panel 100 and a panel driver. The panel driver includes a gate driver 200, a data driver 300, and a controller 400.

The display panel 100 includes a first substrate 110, a second substrate 120 facing the first substrate 110, and a liquid crystal layer (not shown) disposed between the first substrate 110 and the second substrate 120. The first substrate 110 includes a plurality of gate lines GL, a plurality of data lines DL, and a plurality of switching elements connected to the gate lines GL and the data lines DL. For example, the first substrate 110 may be an array substrate and the second substrate 120 may include a color filter and a common electrode. The second substrate 120 may be a color filter substrate.

The array substrate 110 may include an active region AR for displaying an image and a peripheral region adjacent to the active region AR. The array substrate 110 may include a gate peripheral region GPR corresponding to the gate driver 200 and a data peripheral region DPR corresponding to the data driver 300.

The data lines DL1 to DL6, the gamma lines GML1 to GML6, a repair pad REP, a repair line RL, inspection pads VP1, VP2, and VP3 and inspection lines VL1, VL2, and VL3 are disposed in the data peripheral region DPR of the array substrate 110.

The gamma lines GML1 to GML6 may receive the gamma reference voltage from the gamma reference voltage generator and may transmit the gamma reference voltage to the data driving chip. The gamma lines GML1 to GML6 may include gamma bump parts GMB1 to GMB6, respectively to connect the gamma lines GML1 to GML6 to the data driving chip. The gamma bump parts GMB1 to GMB6 include gamma chip contact parts GMCI1 to CMCI6, respectively, at which the data driving chip is connected to the gamma lines GML1 to GML6.

The repair pad REP and the repair line RL have a larger area relative to the gamma lines GML1 to GML6. When a static electricity is applied to the repair pad REP, the static electricity flows from the repair pad REP through the repair line RL. The static electricity may be transmitted from the repair line to the gamma lines GML1 to GML6 so that the gamma lines GML1 to GML6 may be burnt and cut.

Hereinafter, a structure of the first gamma line GML1 is explained referring again to FIG. 5 in detail.

The first gamma line GML1 includes a first gamma bump part GMB1 which may be connected to the data driving chip. The first gamma bump part GMB1 includes a first contact part GMCI1, at which the first gamma line GML1 may be connected to the data driving chip.

The first gamma line GML1 further includes a first portion GMLA disposed at a first side of the first gamma bump part GMB1 and a second portion GMLB disposed at a second side of the first gamma bump part GMB1 opposite to the first side. The second portion GMLB of the first gamma line GML1 is connected to the first inspection line VL1.

The first portion GMLA has a smaller width than a width of the first gamma bump part GMB1. The second portion GMLB has a smaller width than the width of the first gamma bump part GMB1.

In the present exemplary embodiment, the first portion GMLA and the second portion GMLB may be formed from a second metal layer.

For example, the first portion GMLA and the second portion GMLB may be formed from a data metal layer. In addition, the repair line RL may be formed from a gate metal layer. The inspection lines VL1, VL2, and VL3 may be formed from the data metal layer. The data lines DL1 to DL6, which may overlap with the data driving chip, may be formed from the gate metal layer. While the data lines DL1 to DL6 that overlap with the data driving chip may be formed from the gate metal layer, the data lines DL1 to DL6 in the active region AR may be formed from the data metal layer. Thus, the data lines DL1 to DL6 in the data peripheral region DPR have a double layer structure and include the contact part to connect two layers.

The second portion GMLB may be disposed on the same layer as the inspection lines VL1, VL2, and VL3.

A cutting line CL is formed between the first gamma bump parts GMB1 to GMB6 and the inspection lines VL1 to VL3. In a first inspection step using the inspection pads VP1 to VP3, the array substrate is not cut at the cutting line CL. In the first inspection step, the display panel 100 is inspected using the first to third inspection pads VP1, VP2, and VP3.

When the first inspection step finishes, the array substrate 110 is cut at the cutting line CL. The second portion GMLB of the gamma lines GML1 to GML6 are cut along cutting line CL. Thus, a portion below the cutting line CL does not affect the display panel 100 after the first inspection step.

After cutting the array substrate 110 at the cutting line CL, the gate driving chip and the data driving chip are mounted on the array substrate 110, and the printed circuit board 410 is attached to the array substrate 110 through the flexible printed circuit board 420. Then, a second inspection step is performed.

In the present exemplary embodiment, the gamma lines GML1 to GML6 are cut at the cutting line CL of the array substrate 110. Thus, the gamma lines GML1 to GML6 extend to the cutting line CL of the array substrate 110.

According to the present exemplary embodiment, the gamma lines GML1 to GML6 are connected to the first inspection line VL1 so that total area of lines and electrodes connected to the gamma lines GML1 to GML6 increases. Thus, static electricity flowing through the repair line RL may not be transmitted from the repair line RL to the gamma lines GML1 to GML6, so that the gamma lines GML1 to GML6 may not be burnt or cut. Therefore, defects in the display panel 100 may be reduced.

FIG. 6 is a plan view illustrating a first pad part P1 and a first data bump group DBP1 according to an exemplary embodiment of the present inventive concept.

The array substrate and the display apparatus according to the present exemplary embodiment are substantially the same as the array substrate and the display apparatus of the previous exemplary embodiment explained referring to FIGS. 1 to 3, except that the gamma lines are connected to one another. Thus, the same reference numerals will be used to refer to the same or like parts as those described in the previous exemplary embodiment of FIGS. 1 to 3 and any repetitive explanation concerning the above elements will be omitted.

Referring to FIGS. 1 and 6, the display apparatus includes a display panel 100 and a panel driver. The panel driver includes a gate driver 200, a data driver 300, and a controller 400.

The display panel 100 includes a first substrate 110, a second substrate 120 facing the first substrate 110 and a liquid crystal layer (not shown) disposed between the first substrate 110 and the second substrate 120. The first substrate 110 includes a plurality of gate lines GL, a plurality of data lines DL, and a plurality of switching elements connected to the gate lines GL and the data lines DL. For example, the first substrate 110 may be an array substrate and the second substrate 120 may include a color filter and a common electrode. The second substrate 120 may be a color filter substrate.

The array substrate 110 may include an active region AR for displaying an image and a peripheral region adjacent to the active region AR. The array substrate 110 may include a gate peripheral region GPR corresponding to the gate driver 200, and a data peripheral region DPR corresponding to the data driver 300.

The data lines DL1 to DL6, the gamma lines GML1 to GML6, a repair pad REP, a repair line RL, inspection pads VP1, VP2, and VP3, and inspection lines VL1, VL2, and VL3, are disposed in the data peripheral region DPR of the array substrate 110.

The gamma lines GML1 to GML6 may receive the gamma reference voltage from the gamma reference voltage generator. The gamma lines GML1 to GML6 may transmit the gamma reference voltage to the data driving chip. The gamma lines GML1 to GML6 include gamma bump parts GMB1 to GMB6, respectively, to connect the gamma lines GML1 to GML6 to the data driving chip. The gamma bump parts GMB1 to GMB6 include gamma chip contact parts GMCI1 to CMCI6, respectively, at which the data driving chip is connected to the gamma lines GML1 to GML6.

The repair pad REP and the repair line RL have a larger area relative to the gamma lines GML1 to GML6. When static electricity is applied to the repair pad REP, the static electricity may flow from the repair pad REP through the repair line RL. The static electricity may be transmitted from the repair line RL to the gamma lines GML1 to GML6 so that the gamma lines GML1 to GML6 may be burnt and cut.

The first gamma line GML1, including a first gamma bump part GMB1, may be connected to the data driving chip. The first gamma bump part GMB1 includes a first contact part GMCI1, at which the first gamma line GML1 may be connected to the data driving chip.

The first gamma line GML1 further includes a first portion GMLA disposed at a first side of the first gamma bump part GMB1 and a second portion GMLB disposed at a second side of the first gamma bump part GMB1, opposite to the first side. In the present exemplary embodiment, the second portion GMLB of the first gamma line GML1 is connected to the second portions GMLB of adjacent gamma lines GML2 to GML6.

The first portion GMLA has a smaller width than a width of the first gamma bump part GMB1. The second portion GMLB has a smaller width than the width of the first gamma bump part GMB1.

In the present exemplary embodiment, the first portion GMLA may be formed from a first metal layer and the second portion GMLB may be formed from a second metal layer different from the first metal layer. Thus, the first gamma line GML1 further includes a second contact part GMC1 at which the first portion GMLA and the second portion GMLB may be connected. For example, the second contact part GMC1 is disposed in the first gamma bump part GMB1. Alternatively, the first portion GMLA and the second portion GMLB may be formed from the second metal layer.

A cutting line CL is formed between the first gamma bump parts GMB1 to GMB6 and the inspection lines VL1 to VL3. In a first inspection step using the inspection pads VP1 to VP3, the array substrate is not cut at the cutting line CL. In the first inspection step, the display panel 100 is inspected using the first to third inspection pads VP1, VP2, and VP3.

When the first inspection step finishes, the array substrate 110 is cut at the cutting line CL. The second portion GMLB of the gamma lines GML1 to GML6 are cut along cutting line CL. Thus, a portion below the cutting line CL does not affect the display panel 100 after the first inspection step.

After cutting the array substrate 110 at the cutting line CL, the gate driving chip and the data driving chip are mounted on the array substrate 110, and the printed circuit board 410 is attached to the array substrate 110 through the flexible printed circuit board 420. Then, a second inspection step is performed.

In the present exemplary embodiment, the gamma lines GML1 to GML6 are cut at the cutting line CL of the array substrate 110. Thus, the gamma lines GML1 to GML6 extend to the cutting line CL of the array substrate 110.

According to the present exemplary embodiment, the gamma lines GML1 to GML6 are connected to one another so that total area of lines connected to the gamma lines GML1 to GML6 increases. Thus, static electricity flowing through the repair line RL may not be transmitted from the repair line RL to the gamma lines GML1 to GML6, so that the gamma lines GML1 to GML6 may not be burnt or cut. Therefore, defects in the display panel 100 may be reduced.

According to exemplary embodiments of the present inventive concept as explained above, the cut of the gamma line due to the static electricity is prevented so that the defect rate of the display panel may be reduced. Thus, the yield rate of the display panel may be improved and a manufacturing cost of the display panel may be reduced.

The foregoing is illustrative of the present inventive concept and is not to be construed as limiting thereof. Although a few exemplary embodiments of the present inventive concept have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of the present inventive concept and is not to be construed as limited to the specific exemplary embodiments disclosed, and that modifications to the disclosed exemplary embodiments, as well as other exemplary embodiments, are intended to be included within the scope of the appended claims. The present inventive concept is defined by the following claims, with equivalents of the claims to be included therein.

What is claimed is:

1. An array substrate, comprising:
a substrate comprising an active region;
data lines configured to transmit a data voltage to the active region;
gamma lines configured to receive a gamma voltage, the data voltage generated according to the gamma voltage;
a repair pad disposed on the substrate, the repair pad configured to receive a repair signal configured to repair at least one of the data lines;
a repair line extending from the repair pad and disposed adjacent to at least one of the gamma lines;
an inspection pad disposed on the substrate, the inspection pad configured to receive an inspection signal; and
an inspection line configured to transmit the inspection signal from the inspection pad to the data lines,
wherein the gamma lines overlap the repair line and are connected to the inspection line.

2. The array substrate of claim 1, wherein:
each of the gamma lines comprises a gamma bump part electrically connected to a data driving chip; and
the gamma bump part comprises a first contact part electrically connecting the gamma line to the data driving chip.

3. The array substrate of claim 2, wherein each of the gamma lines further comprises:
a first portion disposed at a first side of the gamma bump part; and
a second portion disposed at an opposing second side of the gamma bump part, the second portion being electrically connected to the inspection line.

4. The array substrate of claim 3, wherein:
the width of the first portion is less than the width of the gamma bump part; and
the width of the second portion is less than the width of the gamma bump part.

5. The array substrate of claim 3, wherein:
the first portion comprises a first metal layer;
the second portion comprises a second metal layer different from the first metal layer; and
each of the gamma lines further comprises a second contact part electrically connecting the first portion and the second portion.

6. The array substrate of claim 5, wherein the second contact part is disposed in the gamma bump part.

7. The array substrate of claim 3, wherein the first portion and the second portion comprise a first metal layer.

8. The array substrate of claim 3, wherein the second portion is disposed in a same layer as the inspection line.

9. The array substrate of claim 3, wherein:
a cutting line is disposed between the gamma bump part and the inspection line; and
the second portion is cut by the cutting line.

10. The array substrate of claim 1, wherein:
the repair line is disposed between the gamma lines and the data lines.

11. An array substrate, comprising:
a substrate comprising an active region;
data lines configured to transmit a data voltage to the active region;
gamma lines configured to receive a gamma voltage, the data voltage generated according to the gamma voltage;
a repair pad disposed on the substrate, the repair pad configured to receive a repair signal configured to repair at least one of the data lines; and
a repair line extending from the repair pad and disposed adjacent to at least one of the gamma lines,
wherein the gamma lines overlap the repair line and are connected to one another.

12. The array substrate of claim 11, wherein:
each of the gamma lines comprises a gamma bump part electrically connected to a data driving chip; and
the gamma bump part comprises a first contact part electrically connecting the gamma line to the data driving chip.

13. The array substrate of claim 12, wherein each of the gamma lines further comprises:
a first portion disposed at a first side of the gamma bump part; and
a second portion disposed at an opposing second side of the gamma bump part, the second portion being connected to the inspection line.

14. The array substrate of claim 13, further comprising:
an inspection pad disposed on the substrate, the inspection pad configured to receive an inspection signal; and
an inspection line configured to transmit the inspection signal form the inspection pad to the data lines.

15. The array substrate of claim 14, wherein:
a cutting line is disposed between the gamma bump part and the inspection line; and
the second portion is cut by the cutting line.

16. A display apparatus, comprising:
an array substrate comprising:
    a substrate comprising an active region;
    data lines configured to transmit a data voltage to the active region;
    gamma lines configured to receive a gamma voltage;
    a repair pad disposed on the substrate, the repair pad configured to receive a repair signal configured to repair at least one of the data lines;
    a repair line extending from the repair pad and disposed adjacent to at least one of the gamma lines;
    an inspection pad disposed on the substrate, the inspection pad configured to receive an inspection signal; and
    an inspection line configured to transmit the inspection signal from the inspection pad to the data lines; and
a data driving chip overlapping the data lines and the gamma lines, the data driving chip mounted on the array substrate and configured to:
    receive the gamma voltage via the gamma lines;
    generate the data voltage according to the gamma voltage; and
    apply the data voltage to the data lines,
wherein the gamma lines overlap the repair line and are electrically connected to the inspection line.

17. The display apparatus of claim 16, wherein:
each of the gamma lines comprises a gamma bump part electrically connected to the data driving chip; and
the gamma bump part comprises a first contact part electrically connecting the gamma line to the data driving chip.

18. The display apparatus of claim 17, wherein each of the gamma lines further comprises:
a first portion disposed at a first side of the gamma bump part; and
a second portion disposed at an opposing second side of the gamma bump, the second portion being electrically connected to the inspection line.

19. The display apparatus of claim 18, wherein:
a cutting line is disposed between the gamma bump part and the inspection line; and
the second portion is cut by the cutting line.

* * * * *